United States Patent
Utsumi et al.

(10) Patent No.: US 7,067,974 B2
(45) Date of Patent: Jun. 27, 2006

(54) LIGHT-EMITTING APPARATUS AND METHOD FOR FORMING THE SAME

(75) Inventors: Tetsuya Utsumi, deceased, late of Kariya (JP); by Tomoko Utsumi, legal representative, Kariya (JP); Masaaki Arima, Kariya (JP); Masayuki Harada, Kariya (JP); Mari Funada, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 0 days.

(21) Appl. No.: 11/282,419

(22) Filed: Nov. 17, 2005

(65) Prior Publication Data

US 2006/0066232 A1    Mar. 30, 2006

Related U.S. Application Data

(62) Division of application No. 10/844,781, filed on May 13, 2004.

(30) Foreign Application Priority Data

May 16, 2003  (JP)  .............................. 2003-139226
May 16, 2003  (JP)  .............................. 2003-139487

(51) Int. Cl.
  *H01J 1/62*  (2006.01)
  *H01J 1/64*  (2006.01)
  *B32B 3/10*  (2006.01)

(52) U.S. Cl. ....................... 313/506; 313/498; 428/141

(58) Field of Classification Search ................. 313/506
See application file for complete search history.

(56) References Cited

U.S. PATENT DOCUMENTS

| 5,620,348 | A  | * | 4/1997 | Santana et al. ............. 313/506 |
| 2001/0033135 | A1 | * | 10/2001 | Duggal et al. .............. 313/506 |
| 2004/0012980 | A1 | * | 1/2004 | Sugiura et al. ............. 362/560 |
| 2004/0027062 | A1 | * | 2/2004 | Shiang et al. ............... 313/506 |
| 2004/0104672 | A1 | * | 6/2004 | Shiang et al. ............... 313/506 |
| 2004/0227140 | A1 |   | 11/2004 | Lee et al. ....................... 257/79 |
| 2004/0239240 | A1 | * | 12/2004 | Kato .......................... 313/506 |
| 2004/0253413 | A1 |   | 12/2004 | Babe et al. ................. 428/141 |
| 2005/0127822 | A1 | * | 6/2005 | Takeuchi et al. ............ 313/503 |

FOREIGN PATENT DOCUMENTS

| JP | 01-105987 | 4/1989 |
| JP | 01-186588 | 7/1989 |
| JP | 06-250182 | 9/1994 |
| JP | 08-335044 | 12/1996 |
| JP | 9-50031 | 2/1997 |
| JP | 9-129375 | 5/1997 |
| JP | 10-144469 | 5/1998 |
| JP | 2002-352956 | 12/2002 |
| JP | 2003-059641 | 2/2003 |

* cited by examiner

*Primary Examiner*—Peter J. Macchiarolo
(74) *Attorney, Agent, or Firm*—Morgan & Finnegan, LLP

(57) ABSTRACT

In a bottom emission type light-emitting apparatus, a face of a substrate, which is opposite from a light-emitting device, is an uneven surface having a plurality of asperities. The mean spacing Sm of adjacent asperities or the mean spacing S of peaks of adjacent projections of the asperities is no less than three times the longest wavelength of light generated by the light-emitting layer and no more than two hundred times the longest wavelength. The arithmetic mean slope $\Delta a$ of the uneven surface is in a range between 3° and 20°, inclusive. Therefore, the apparatus substantially has higher extraction efficiency and a higher brightness in a specific direction.

13 Claims, 6 Drawing Sheets

LIGHT-EMITTING APPARATUS AND METHOD FOR FORMING THE SAME

BACKGROUND OF THE INVENTION

This application claims priority and is a divisional of U.S. patent application Ser. No. 10/844,781 filed on May 13, 2004.

The present invention relates to a bottom emission type light-emitting apparatus having a substrate on which a light emitting device is formed. The light-emitting device is an organic electroluminescent device (organic EL device) or an inorganic electroluminescent element (inorganic EL elements). Such a device has a light-emitting layer held between a pair of electrodes. A bottom emission type light-emitting apparatus emits light generated by the light-emitting layer through a substrate. The present invention also pertains to a method for forming the apparatus.

Lighting systems and displays using a light-emitting apparatus such as an organic electroluminescent apparatus (organic EL apparatus) and an inorganic electroluminescent apparatus (inorganic EL apparatus) have been proposed. Such light-emitting apparatuses are roughly divided into a bottom emission type, which emits light generated by a light-emitting layer through a substrate, and a top emission type, which emits light through a side opposite from a substrate.

It has been pointed out that bottom emission type light emitting apparatuses extract relatively small portion of light that is generated by a light-emitting layer.

In a bottom emission type organic EL apparatus shown in FIG. 13, light that enters a transparent substrate 100 is not entirely emitted through a light exit surface 100a of the transparent substrate 100. For example, some of the light reaches the light exit surface 100a at an angle that is greater than a critical angle, which is defined by the transparent substrate 100 and an outside atmosphere (typically, air). Such light includes a portion that is reflected toward an organic EL device 200 and extracted outside the apparatus through an edge as a ray h1, and a portion that attenuates in the apparatus as a ray h2. These portions of light cannot be utilized.

Conventionally, techniques to cope with the above drawbacks have been disclosed (for example, Japanese Laid-Open Patent Publication No. 9-129375). Specifically, the surface of a transparent substrate at the light exit side (light extraction face) is formed as a diffuse surface (uneven face having asperities) so that the containment of light due to total reflection at the light extraction face is decreased. The extraction efficiency is improved.

However, in some cases, forming asperities on the light extraction face practically does not improve the extraction efficiency compared to a case where no uneven face is provided.

Without increasing the amount of light emitted in a specific direction from the light exit surface, light extracted from a light emitting apparatus substantially cannot be used.

SUMMARY OF THE INVENTION

Accordingly, it is an objective of the present invention to provide a bottom emission type light-emitting apparatus that substantially has higher extraction efficiency and a higher brightness in a specific direction than light-emitting apparatus having no asperities on light extraction face, and permits light extracted from the apparatus to be used substantially. The present invention also pertains to a method for forming such an apparatus.

To achieve the above-mentioned objective, the present invention provides a light-emitting apparatus. The apparatus includes a substrate and a light-emitting device provided on the substrate. The device includes a light-emitting layer located between a pair of electrodes. Light generated by the light-emitting layer is emitted to the outside of the apparatus through the substrate. The substrate has a first face on which the device is formed and a second face located at a side opposite from the first face. The second face is an uneven surface having a plurality of asperities. The mean spacing Sm of adjacent asperities or the mean spacing S of peaks of adjacent projections of the asperities is no less than three times the longest wavelength of light generated by the light-emitting layer and no more than two hundred times the longest wavelength. At least one of the following requirements (i)–(vi) is satisfied:

(i) The arithmetic mean slope $\Delta a$ of the uneven surface is in a range between 3° and 20°, inclusive;

(ii) The root mean square slope $\Delta q$ of the uneven surface is in a range between 4° and 25°;

(iii) The ratio Ra/S of the arithmetic mean roughness Ra of the uneven surface to the mean spacing S of peaks is in a range between 0.01 and 0.07, inclusive;

(iv) The ratio Ra/Sm of the arithmetic mean roughness Ra of the uneven surface to the mean spacing Sm of asperities is in a range between 0.004 and 0.035, inclusive;

(v) The ratio Rz/S of the ten-point height of irregularities Rz of the uneven surface to the mean spacing S of peaks is in a range between 0.05 and 0.30, inclusive; and (vi) The ratio Rz/Sm of the ten-point height of irregularities Rz of the uneven surface to the mean spacing Sm of asperities is in a range between 0.025 and 0.14, inclusive.

According to another aspect of the invention, a method for manufacturing a light-emitting apparatus is provided. The method includes a step of preparing a substrate having a first face and a second face. The second face is located at a side opposite from the first face. The method includes steps of forming on the first face a light-emitting device having a light-emitting layer and a pair of electrodes between which the light-emitting layer is located; and forming an uneven surface having a plurality of asperities on the second face. The mean spacing Sm of adjacent asperities or the mean spacing S of peaks of adjacent projections of the asperities is no less than three times the longest wavelength of light generated by the light-emitting layer and no more than two hundred times the longest wavelength. The uneven surface is formed such that at least one of the requirements (i)–(vi) is satisfied.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
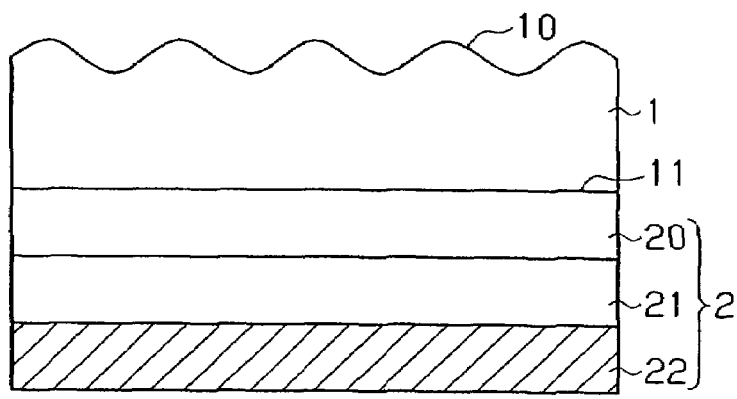
FIG. 1 is a cross-sectional view illustrating a first organic EL apparatus according to one embodiment of the present invention.

Several embodiments of the present invention will now be described with reference to the drawings. Same reference numerals are similar or the same in the drawings. A first organic EL apparatus will now be described.

As shown in FIG. 1, the first organic EL apparatus is of a bottom emission type that includes a transparent substrate 1 and an organic EL device 2. Asperities are formed on one face of the transparent substrate 1 (a light exit surface 10). In other words, the light exit surface 10 is an uneven surface. The organic EL device 2 is formed on an incident surface 11.

<Substrate 1>

The substrate 1 is a substantially plate-shaped transparent member that supports the organic EL device 2. The substrate 1 has the incident surface 11 on which the organic EL device 2 is formed, and a light exit surface 10 that is located opposite from the incident surface 11. The substrate 1 receives light from the organic EL device 2 through the incident surface 11, and emits the received light through the light exit surface 10.

The first organic EL apparatus is characterized in that the light exit surface 10 is formed into an uneven surface that satisfies the following requirement (i).

(i) The arithmetic mean slope Δa is in a range between 3° and 20°.

The arithmetic mean slope Δa is specified in JIS B0601-1994. The arithmetic mean slope Δa is computed in the following manner. First, a measured curve is divided along a mean line into sections each of which has a length of ΔX. Then, the absolute value of the inclination angle of a line segment of each section, which line segment connects the starting point and the endpoint of the section, is obtained. Thereafter, a mean value of the obtained absolute values is computed. That is, the arithmetic mean slope Δa is computed using the following equation.

$$\Delta a = \frac{1}{n-1} \sum_{i=1}^{n-1} \left\{ \tan^{-1} \left| \left( \frac{\Delta Yi}{\Delta X} \right) \right| \right\}$$

In this equation, the inclination angle is expressed as follows.

$$\tan^{-1} \frac{\Delta Yi}{\Delta X}$$

The light exit surface 10 is preferably formed into an uneven face that satisfies the following requirement (ii), instead of the above requirement (i). More preferably, the light exit surface 10 is formed into an uneven face that satisfies the following requirement (iii), instead of the above requirement (i). Most preferably, the light exit surface 10 is formed into an uneven face that satisfies the following requirement (iv), instead of the above requirement (i).

(ii) The arithmetic mean slope Δa is in a range between 5° and 20°.

(iii) The arithmetic mean slope Δa is in a range between 8° and 18°.

(iv) The arithmetic mean slope Δa is in a range between 12° and 14.5°.

The uneven surface (the light exit surface 10) is designed to satisfy the following requirement (a) or (b).

This is because, if Sm or S is set no less than the following lower limit values, simulations of geometrical optics can be performed, which significantly facilitates the design of the optical properties of the organic EL apparatus.

If Sm or S is more than the following upper limit values, the incident surface 11 is thought to be optically flat. In this case, the incident surface 11 is substantially in the same conditions as a case where no asperities are formed thereon.

(a) The mean spacing Sm of adjacent asperities is no less than three times the longest wavelength of the light generated by the light-emitting layer and no more than two hundred times the longest wavelength.

(b) The mean spacing S of peaks of adjacent projections of the asperities is no less than three times the longest wavelength of the light generated by the light-emitting layer and no more than two hundred times the longest wavelength.

The mean spacing Sm of adjacent asperities is specified in JIS B0601-1994. The mean spacing Sm of asperities is computed in the following manner. First, a section that corresponds to a referential length L is chosen from a roughness curve along a direction of a mean line. Then, with respect to the direction along which the mean line extends, a distance Smi of each peak and an adjacent valley is obtained. Thereafter, a mean value of the distances Smi is computed and expressed in millimeters. That is, the mean spacing Sm of asperities is computed using the following equation.

$$Sm = \frac{1}{n}\sum_{i=1}^{n} Smi$$

The mean spacing S of peaks of adjacent projections of the asperities is specified in JIS B0601-1994. The mean spacing S of peaks is computed in the following manner. First, a section that corresponds to a referential length L is chosen from a roughness curve along a direction of a mean line. Then, with respect to the direction along which the mean line extends, a distance Si between each adjacent pair of the peaks is obtained. Thereafter, a mean value of the distances Si is computed and expressed in millimeters. That is, the mean spacing S of peaks is computed using the following equation.

$$S = \frac{1}{n}\sum_{i=1}^{n} Si$$

As long as the organic EL device 2 can be formed on and supported by the substrate 1 and the substrate 1 is transparent, the substrate 1 may be made of any material. Typically, the substrate 1 is made of glass, quartz, or plastic. Alternatively, the substrate 1 may be formed by combining two or more substrates of the same types or different types.

In this specification, the term "transparent" refers to a state in which the transmittance of light that exits the apparatus is no less than 50%, preferably no less than 80%, and most preferably no less than 90%. Typically, the transparency is determined so that light, the wavelength of which is approximately 400 nm to 800 nm (visible light), exits the apparatus. If the transmittance is too low, light emitted from a light-emitting layer is attenuated, and a required brightness as the light-emitting apparatus can hardly obtained.

The inventors of the present invention found out that the above ranges of the values are preferable for organic EL apparatus through the following examples and comparison examples.

In the examples and the comparison examples, organic EL apparatuses were made while varying the arithmetic mean slope Δa of the light exit surface 10 in a range greater than 0° up to 25°. Other conditions including the materials, the film thicknesses, and the formulae were the same. The process for making the organic EL apparatuses of the examples and the comparison examples will now be described.

Plate-shaped transparent substrates each of which has an incident surface and a light exit surface were prepared. Using masks, photoresist was formed on the light exit surface of each substrate. The photoresist was used to define a pattern corresponding to projections to be formed on the light exit surface. In this state, the light exit surface was etched. Consequently, the light exit surface 10 having asperities was completed. After the light exit surface 10 was formed, the arithmetic mean slope Δa of the light exit surface 10 was measured with a roughness meter.

After measuring the arithmetic mean slope Δa, a transparent electrode, or the first electrode 20 having a thickness of 50 nm, was formed of ITO on the incident surface 11 through the RF sputtering. After forming the first electrode 20, an organic light-emitting layer 21 was formed with a vacuum deposition apparatus, or a carbon crucible. At this time, the deposition speed was 0.1 nm/s, and the degree of vacuum was $5.0\times10^{-5}$ Pa. The formed organic light-emitting layer 21 included a hole injection transport layer, a layer that contains an organic light-emitting material, and an electron injection transport layer. The hole injection transport layer was formed of TPTE and the thickness was 80 nm. The organic light-emitting material containing layer was formed by co-depositing DPVBi (93.0 weight %) and BCzVBi (7.0 weight %), and the thickness was 30 nm. The electron injection transport layer was formed of 2,5-bis(6'-(2',2"-bipyridyl))-1,1-dimethyl-3,4-diphenylsilole, and the thickness was 20 nm. Thereafter, an aluminum layer (second electrode) 22 having a thickness of 150 nm was formed with a tungsten boat. At this time, the deposition speed was 1 nm/s, and the degree of vacuum was $5.0\times10^{-5}$ Pa. The organic EL apparatus was thus completed. Each organic EL apparatus was sealed with a conventional protective film (passivation film).

[Evaluation 1]

Figure 2:
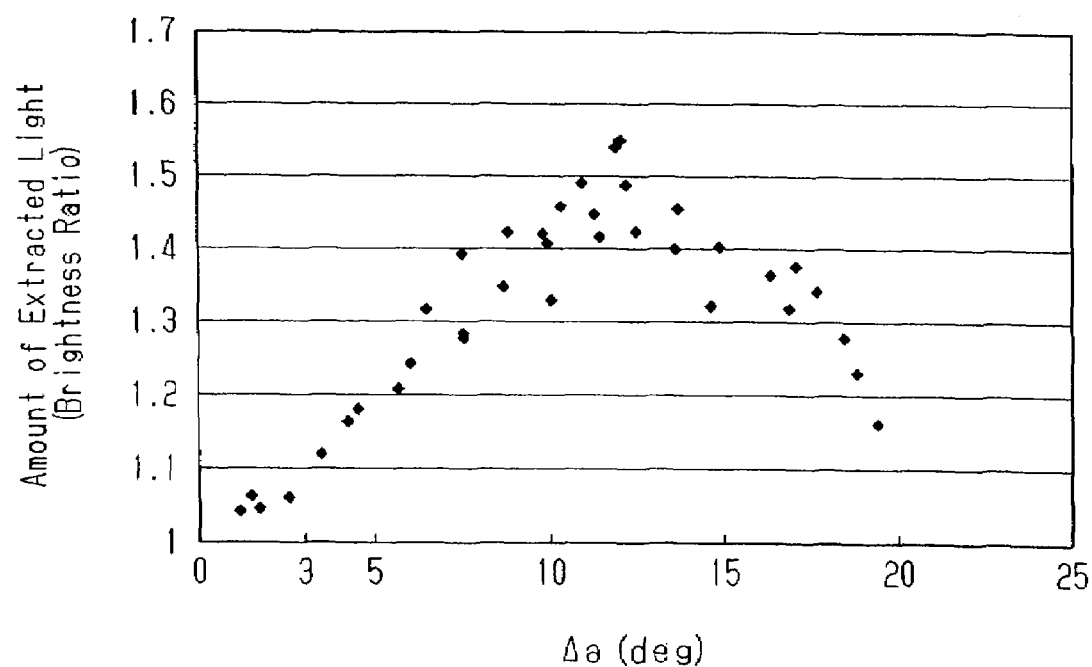
FIG. 2 is a graph showing the relationship between the arithmetic mean slope $\Delta a$ of a light exit surface of the first organic EL apparatus and the amount of light emitted to the outside through the light exit surface.

The same current was supplied to each of the formed organic EL apparatuses, and the total amount of light emitted from each of the light exit surfaces 10 was measured with a brightness meter. The relationship between the arithmetic mean slope Δa of the light exit surface 10 and the brightness of the organic EL apparatuses is shown in the graph of FIG. 2. The brightness is expressed as a ratio (brightness ratio) to the brightness of an organic EL apparatus that has an organic EL device 2 formed in the same manner as described above but has no asperities on the light exit surface 10. The brightness of the referential organic EL apparatus is plotted on a position where the arithmetic mean slope Δa is 0°. The inventors evaluated the experiment results of FIG. 2 as follows.

When the light exit surface 10 was formed into an uneven surface the arithmetic mean slope Δa of which is in a range between 3° and 20°, inclusive, the amount of light extracted to the outside through the light exit surface 10 was 1.1 times that of the referential organic EL apparatus. The reason for this is considered to be as follows. That is, if a light exit surface 10 is flat, light that reaches the light exit surface 10 at an angle greater than the critical angle is totally reflected into the transparent substrate 1. However, if the light exit surface 10 is formed into an uneven surface, the light exit surface 10 has tangents of various angles. Therefore, it is possible to extract part or all of the light that would be conventionally not extracted to the light extraction side.

Accordingly, the inventors also found out that, when the light exit surface 10 was formed into an uneven surface the arithmetic mean slope Δa of which is in a range less than 3°, the amount of light extracted to the outside through the light exit surface 10 was substantially the same as that of the referential organic EL apparatus. That is, it was found out that, if an uneven surface suitable for extraction of light is not provided, the amount of extracted light is substantially the same as that of a flat light exit surface.

When the light exit surface 10 was formed into an uneven surface the arithmetic mean slope Δa of which is in a range between 5° and 20°, inclusive, the amount of light extracted to the outside through the light exit surface 10 was 1.2 times that of the referential organic EL apparatus. That is, it was found out that this requirement is suitable for extracting light.

When the light exit surface 10 was formed into an uneven surface the arithmetic mean slope Δa of which is in a range between 8° and 18°, inclusive, the amount of light extracted to the outside through the light exit surface 10 was 1.3 times that of the referential organic EL apparatus. That is, the extraction efficiency was significantly increased.

When the light exit surface 10 was formed into an uneven surface the arithmetic mean slope Δa of which is in a range between 12° and 14.5°, inclusive, the amount of light extracted to the outside through the light exit surface 10 was 1.4 times that of the referential organic EL apparatus. That is, the extraction efficiency was particularly increased.

[Evaluation 2]

The chromaticity was measured in various light emitting directions from the light exit surface 10 of the formed organic EL apparatuses. The measurement revealed that in a range of the arithmetic mean slope Δa between 3° and 20°, inclusive, the chromaticity hardly changes according to the extraction direction. That is, the chromaticity had no dependence on the extraction angle.

The reason for this is considered to be that each of the depressions and the projections of the asperities on the light exit surface 10 has a shape optimized for diffusing light in various directions. That is, since the shape of the light exit surface 10 was optimized, the brightness of light of each wavelength from the light exit surface 10 had no dependence on the angle of extraction.

[Evaluation 3]

The brightness was measured in various light emitting directions from the light exit surface 10 of the formed organic EL apparatuses. The measurement revealed that in all the apparatus, the brightness in a certain direction was higher than that of other directions. Since the brightness is not equally high in all the extraction directions, the apparatuses are suitable for usage where the brightness in a specific direction needs to be high, for example, for displays and lighting systems.

An organic EL device 2 will now be described.

<Organic EL Device 2>

As shown in FIG. 1, the organic EL device 2 has a pair of electrodes 20, 22, and an organic light-emitting layer 21 held between the electrodes 20, 22. The light-emitting layer 21 contains organic light-emitting material. The organic EL device 2 emits light of a predetermined color (light of a predetermined wavelength or light of a predetermined chromaticity). A conventional organic EL device can be used for the organic EL device 2.

[First Electrode 20]

Since the first electrode 20 of the first organic EL apparatus, which is the bottom emission type, is formed on the light extraction side with respect to the organic light-emitting layer 21, the first electrode 20 needs to be transparent. The first electrode 20 may be anode or cathode. The material for the first electrode 20 (transparent electrode) is preferably a material that permits carrier (holes or electrons) to be efficiently injected into the organic light-emitting layer 21.

As the anode, a material the work function of which is 4.5 eV to 5.5 eV is favorable. Specifically, a material having any one of indium tin oxide (ITO), indium zinc oxide (IZO), indium oxide ($In_2O_3$), tin oxide ($SnO_2$), and zinc oxide (ZnO) as a main component is favorable.

These oxides may be more or less biased from the stoichiometry. The preferable range of the mixing ratio of $SnO_2$ relative to $In_2O_3$ in ITO is for example 1 to 20 wt %, and preferably 5 to 12 wt %. The preferable range of the mixing ratio of ZnO relative to $In_2O_3$ in IZO is for example 12 to 32 wt %. Further, if the average mixing ratio is in these ranges in the entire transparent first electrode 20, a concentration gradient may exist in the thickness direction.

Other than the components listed above, oxides of Sn, Ti, and Pb may be contained in the material of the anode at 1 wt % in terms of oxide.

The cathode is an electrode for injecting electrons in the organic layer. To increase the efficiency of the electron injection, a metal, an alloy, an electroconductive compound, and a mixture of these having a work function that is less than 4.5 eV, generally no more than 4.0 eV, typically no more than 3.7 eV, is used as the material for the electrode.

The materials listed for the anode may be used for the cathode. Also, the following materials may be used.

For example, an electrode made by laminating a transparent conductive oxide on a super thin film made of a magnesium-silver alloy may be used. In the cathode, a buffer layer containing copper phthalocyanine is preferably provided between the cathode and the organic light-emitting layer 21 to prevent the light-emitting layer 21 and other components from being damaged by plasma when sputtering the conductive oxide.

[Organic Light-emitting Layer 21]

The organic light-emitting layer 21 permits recombination of the carriers (electrons or holes) from at least one of the first electrode 20 and the second electrode 22, generates excitons, and causes the excitons to emit electroluminescence (light) when returning to the ground state. The organic light-emitting layer 21 is mainly made of an organic material.

An organic material that gives more than required functions to the organic light-emitting layer 21 may be used. Also, several materials each giving different functions to the light-emitting layer 21 may be used. As these materials, materials used for the organic light-emitting layer of a conventional organic EL device, such as Alq3 or DCM, may be used.

Further, the organic light-emitting layer 21 may have a laminated structure, and each layer may have one of the required functions. In this case, a layer that contains fluorescent material or phosphorescent material (organic light-emitting material) that generates electroluminescence is referred to as an organic light-emitting material containing layer.

For example, an electron injection layer having an electron injection function from the cathode or an electron injection transport layer may be provided between the cathode and the organic light-emitting material containing layer. An electron transport layer having an electron transporting function may be provided between the organic light-emitting material containing layer and the cathode or between the organic light-emitting material containing layer and the electron injection layer. A hole injection layer having a function to inject holes from the anode or a hole injection transport layer may be provided. Alternatively, a hole transport layer having a hole transport function may be provided.

A layer configuration and materials that are the same as those of a conventional organic EL device may be adopted.

The color of emitted light can be adjusted in the same manner as the method for adjusting color of light in conventional organic EL devices. For example, the following adjusting method may be employed.

Selection of types of the material (organic light-emitting material) that gives the organic light-emitting layer 21 a function for generating electroluminescence when returning from a state of excitons to the ground state.

Adjustment of the mixing ratio of an organic material or an organic light-emitting material added to the organic light-emitting layer 21.

Adjustment of the amount of mixed organic light-emitting material.

Adjustment of the thickness of the organic light-emitting layer 21.

Providing a conventional color filter layer on the organic EL apparatus to limit the wavelength of light that exits the apparatus.

Adding a color changing material that changes the wavelength of received light.

Two or more types of organic light-emitting materials are mixed so that two or more colors are generated, thereby expressing additive color.

Adding a material that promotes or hinders light-emitting to adjust the color of the generated light.

Adjusting the color of the generated light by the amount of current supplied to the organic light-emitting layer 21.

[Second Electrode 22]

If the first electrode 20 is an anode, the second electrode 22 is a cathode. If the first electrode 20 is a cathode, the second electrode 22 is an anode. Therefore, materials that are used for conventional organic EL devices and satisfy the requirements for an anode or a cathode may be employed. Thus, the materials for the first electrode 20 may be employed for the second electrode 22.

However, since the second electrode 22 preferably increases the extraction efficiency of the apparatus by reflecting light emitted to the side opposite from the light extraction side toward the light extraction side, and reflects light received through the light extraction side when the organic EL device 2 is not emitting light, the second electrode 22 has preferably a reflecting function. When adding a reflecting function to the second electrode 22, a metal or an alloy used in conventional organic EL device may be employed. Specifically, the material for the second electrode 22 is required to have the following properties in addition to the properties required as an anode or a cathode. That is, among the entire wavelength range of the light from the organic light-emitting layer 21 and the light applied from the outside of the apparatus, the material needs to at least reflect light of a wavelength range to be extracted from the light exit surface 10 to the outside of the apparatus.

Also, layers and materials of conventional organic EL devices other than the ones listed above may be employed in combination. For example, without adding light reflecting function to the second electrode 22, a light reflecting member may be provided on a side of the organic light-emitting layer 21 that is opposite from the light extraction side. Also, a semitransparent reflective member (half-mirror) may be provided in the organic EL device 2.

A method for forming the first organic EL apparatus will now be described.

<Forming Method>

The first organic EL apparatus is formed through a conventional method for forming substrates, and a conventional method for forming organic EL devices. In the substrate forming method, asperities satisfying the above mentioned conditions are formed on the light exit surface 10 of the substrate 1. In the organic EL device making method, layers forming the organic EL device 2 are successively formed on the incident surface 11. The first organic EL apparatus may be formed, for example, in the following manner.

Figure 3A:
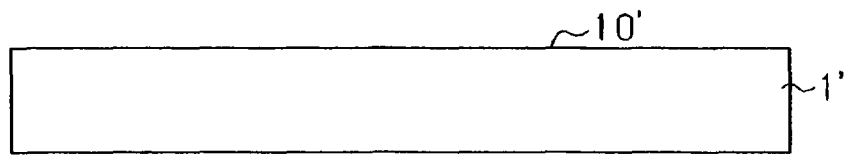
FIGS. 3(a) to 3(c) are cross-sectional views illustrating a process for forming the first organic EL apparatus shown in FIG. 1.
Figure 3B:
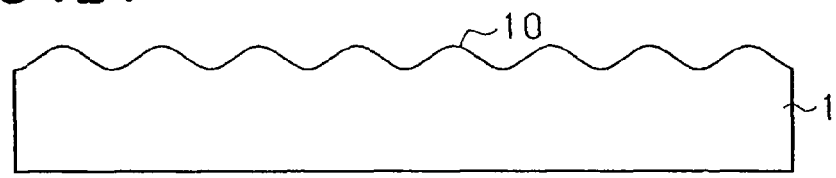

First, a plate-shaped transparent substrate 1' shown in FIG. 3(a) is prepared. To one of the sides (light exit surface) 10' of the transparent substrate 1', a mask the pattern of which corresponds to the arrangement of the depressions and projections to be formed is applied. Then, using the mask, photoresist is formed on the surface to form a pattern. In this state, the transparent substrate 1' is etched so that an uneven face 10 is formed as shown in FIG. 3(b).

Figure 3C:
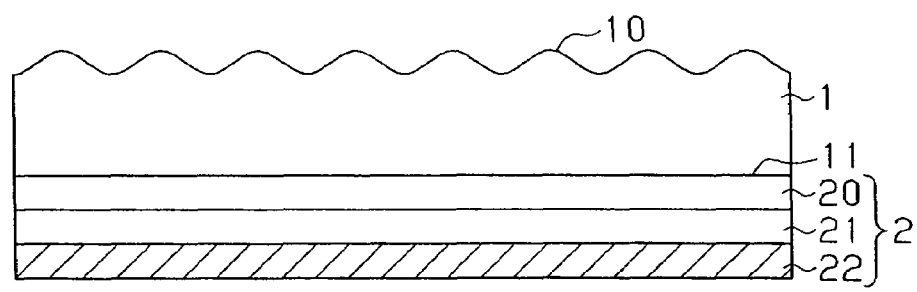

Then, as shown in FIG. 3(c), on the incident surface 11 of the transparent substrate 1, the first electrode 20 is formed. The organic light-emitting layer 21 and the second electrode 22 are also successively formed on the first electrode 20.

The organic EL apparatus is formed in the above described manner.

Instead of etching the light exit surface 10, other method for processing substrates may be employed. For example, a surface treatment of the sandblasting may be employed. Alternatively, a mold having an inner surface with asperities may be used. In this case, molten transparent resin or glass is poured into the mold to form the substrate 1 having the light exit surface 10.

The light exit surface (uneven surface) 10 may be formed after the organic EL device 2 is formed on the transparent substrate 1. In this case, although the uneven surface can be formed through the above described process, the uneven surface is preferably formed through a surface treatment of the sandblasting. This is because a surface treatment of the sandblasting does not require the organic EL device 2 to be protected while blasting sand to the light exit surface 10 for forming the uneven surface.

Further, when forming the uneven surface on the light exit surface 10 after forming the organic EL device 2 on the transparent substrate 1, the transparent substrate 1 may be made thinner at the same time as forming the uneven surface. For example, if the surface treatment through sandblasting is applied, blasting sand to the entire light exit surface 10 not only forms the uneven surface, but also makes the transparent substrate 1 thinner.

Method for forming the uneven surface after forming the organic EL device 2 on the transparent substrate 1 is excellent for the following reasons. That is, since the transparent substrate 1 has a certain thickness, strength, and surface smoothness, each layer of the organic EL device 2 is uniformly formed. Also, after the organic EL device 2 is formed, the thickness of the transparent substrate 1, which does not need to be thick in the formed organic EL apparatus, is reduced. Further, the extraction efficiency is improved.

If the transparent substrate 1 is made thinner, light generated by the organic light-emitting layer 21 is prevented from attenuating in the transparent substrate 1, and the size (thickness) and the weight of the formed organic EL apparatus are reduced.

<Advantages>

The organic EL apparatus according to this embodiment, which has the above described configurations, has the following advantages.

High Extraction Efficiency

Since the light exit surface 10 is optimized as described above, the extraction efficiency is higher than that of conventional organic EL apparatuses having a flat light exit surface.

In other words, the light exit surface 10 has a performance that cannot be obtained by simply forming the asperities on a light exit surface.

Improvement of Brightness in Specific Direction

For example, when the organic EL apparatus emits light, the brightness in a specific direction with respect to the light exit surface 10 is greater than the brightness in other directions. Also, it was found out that the specific direction is changed by altering Δa.

Such change of the brightness is considered to be due to light collecting properties of the depressions, and to reflection and refraction by the depressions and the projections.

Therefore, since the emitted light is effectively used, the first organic EL apparatus is suitable for apparatuses (for example, a display and a lighting system), which are required to have in specific directions compared to in other directions.

Improvement of Reflection Property

Since the organic EL apparatus is designed as described above, glare due to the light that enters the organic EL apparatus is prevented.

Improvement of Chromaticity Property

When the apparatus emits light, the chromaticity is uniform in all light-emitting directions from the light exit surface 10.

This is because since the minute asperities are formed in the light exit surface 10, light of each wavelength is diffused in various directions, and, in the light-emitting directions from the light exit surface 10, the dependence of the brightness of light of each wavelength to the angle is significantly reduced.

The first organic EL apparatus may be modified as follows. Also, two or more of the following modifications may be combined.

Figure 4:
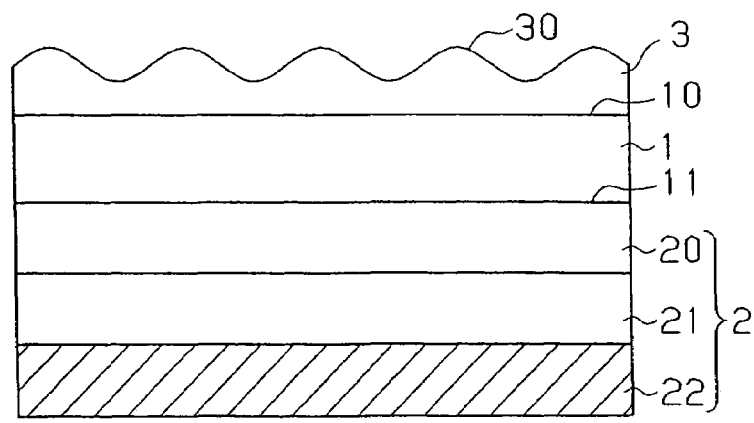
FIG. 4 is a cross-sectional view illustrating a modification of the first organic EL apparatus.

In modification 1, asperities are formed on a member, which is located on the light extraction side of the transparent substrate 1, rather than on the transparent substrate 1. That is, as shown in FIG. 4, instead of forming asperities on the light exit surface 10 of the substrate 1, a member 3 having an uneven surface 30 satisfying the above requirements may be formed at the light extraction side of the transparent substrate 1. In this case, the same advantages are obtained as those listed above.

For example, a transparent resin film that has an uneven surface satisfying the above listed requirement on one side may be used. In this case, the side opposite from the uneven surface of the film is adhered to the light exit surface 10 of the transparent substrate 1. In this specification, an apparatus having a member 3 with an uneven surface that satisfies the above listed requirements attached to the light extraction side with respect to the light exit surface 10 is considered to be equivalent to an apparatus having the light exit surface 10 on which the uneven surface satisfying the above listed requirements is formed.

When providing at the extraction side of the transparent substrate 1, a transparent member 3 having an uneven surface that satisfies the above listed requirements, the refractive index of the member 3 is set approximately the same as that of the substrate 1, and the refractive index of the interface between the member 3 and the substrate 1 is middle those of the member 3 and the substrate 1. The member 3 and the substrate 1 are preferably brought into close contact.

The adhered member 3 may have other functions. For example, the adhered member 3 may have a member that changes the wavelength of received light, or may contain fluorescent material or phosphorescent material. Also, the adhered member 3 may be a color filter.

Forming asperities on the transparent member 3 permits a substrate 1 on which asperities are difficult or impossible to form to be used for a light-emitting apparatus.

Figure 5:
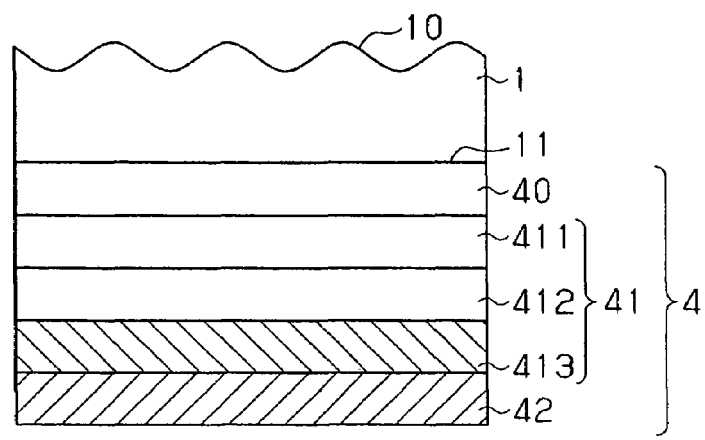
FIG. 5 is a cross-sectional view illustrating a modification of the first organic EL apparatus, in which the light-emitting device is replaced by an inorganic EL device.

In modification 2, an inorganic EL device is employed. That is, in the above embodiment, the organic EL device 2 may be replaced by an inorganic EL device. As shown in FIG. 5, an inorganic EL device 4 includes an inorganic light-emitting layer 41 of a three-layer structure held between a transparent first electrode 40 and a second electrode 42, which is made, for example, of metal and functions as a reflective layer. The inorganic light-emitting layer 41 includes an inorganic light-emitting material containing layer 412 the main component of which is an inorganic material such as zinc sulfide. The inorganic light-emitting material containing layer 412 is held between a pair of insulating layers 411, 413 that are made, for example, of silicon oxide. When an alternating voltage about 200V is applied between the electrodes 40, 42, electrons emitted from the interfaces between the material containing layer 412 and the insulating layers 411, 413 are accelerated. This excites dopant atoms in the inorganic light-emitting layer 41 and thus produces light (electroluminescence). The light is then emitted from the device through the transparent electrode 40.

Figure 6:
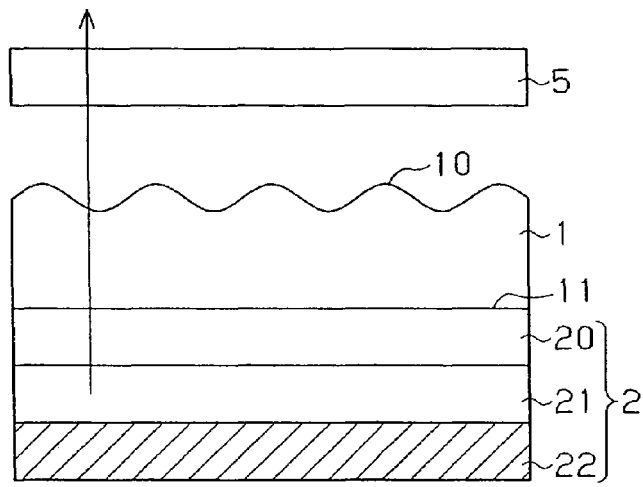
FIG. 6 is a cross-sectional view illustrating the first organic EL apparatus with a prism sheet.

In modification 3, a prism sheet is employed. That is, as shown in FIG. 6, a prism sheet 5 may be provided on a side corresponding to the light extraction side of the light-emitting layer 21. The number of the prism sheet 5 may be two or more.

As described above, the organic EL apparatus of this embodiment is capable of increasing the brightness in a specific direction in accordance with the arithmetic mean slope Δa of the uneven face. Therefore, if one or more prism sheets 5 that change the advancing direction of light emitted in the specific direction to the normal direction of the light exit surface 10 are provided on the light extraction side, the brightness in the normal direction of the light exit surface 10, or the frontward direction of the apparatus, is increased. The apparatus may be designed to increase the brightness of a direction other than the frontward direction.

For the prism sheet 5, any of conventional sheets may be selected according to the light-emitting property of the organic EL apparatus. The selected prism sheet 5 is attached to the organic EL apparatus using any of conventional methods or conventional members.

In modification 4, the first organic EL apparatus is used as a backlight of a liquid crystal display unit. That is, the first organic EL apparatus can be used for a lighting system.

The first organic EL apparatus is suitable for a backlight (backlight source) of a liquid crystal display unit. This is because, compared to conventional organic EL apparatuses, the first organic EL apparatus emits a greater amount of light, has less brightness unevenness, has a higher reflection properties, and has no specular reflection as described above. Therefore, compared to a case where a conventional organic EL apparatus is used as a backlight of a liquid crystal display unit, using the first organic EL apparatus as a backlight increases the brightness, reduces the brightness unevenness, and permits displayed contents to be clearly visible when the apparatus is not emitting light.

Figure 7:
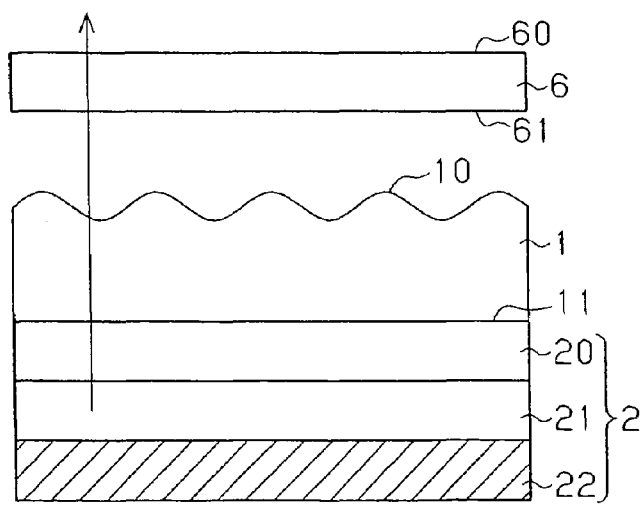
FIG. 7 is a cross-sectional view illustrating a liquid crystal display unit that has the first organic EL apparatus as a backlight.

For example, as shown in FIG. 7, the first organic EL apparatus may be used with a conventional transmissive or semitransparent liquid crystal display panel 6. The panel 6 is arranged so that a non-display face 61 faces the light exit surface 10. That is, the liquid crystal display panel 6 is arranged so that a display face 60 is visible from the outside of the liquid crystal display unit.

When the outside of the unit is sufficiently bright, display content of the liquid crystal panel 6 is clearly visible without activating the organic EL device 2. When the outside of the unit is not sufficiently bright, display content of the liquid crystal panel 6 is visible by activating the organic EL device 2.

In this manner, the display unit having the first organic EL apparatus as a backlight is capable of clearly displaying contents in a well lit place, for example, in the sunlight, and in a dark place, for example, in a room or at night. Also, when there is sufficient outside light, the organic EL device 2 does not need to be activated. Thus, compared to a conventional liquid crystal display unit with a backlight, the display unit of this modification reduces the consumption of the electricity.

In modification 5, the first organic EL apparatus is incorporated in a display. That is, the first organic EL apparatus may be combined with a conventional organic EL device driving method to form a display. As the organic EL device driving method, a passive matrix system or an active matrix system may be employed.

In the passive matrix system, an XY matrix electrode structure using scanning electrodes and signal electrodes is employed. At each of the dots forming the matrix, a display device (the organic EL device 2) is connected. The organic EL devices 2 are driven through the line sequential process and activated (emits light).

In the active matrix system, a switch device and a holding device are provided for each display device (organic EL device 2), that is, for each pixel or sub-pixel. The display devices (organic EL devices 2) are provided at the matrix intersections of the scanning electrodes and the signal electrodes. TFTs are preferably used as the switches.

A second organic EL apparatus will now be described.

The second organic EL apparatus can be configured to be the same as the first organic EL apparatus except for the following points. Also, the second EL apparatus can be modified in the same ways as the first organic EL apparatus.

The second organic EL apparatus substantially has the same configuration as the first organic EL apparatus, and the light exit surface 10 of the second organic EL apparatus is characterized by satisfying any one of the following requirements (v) to (viii), instead of the above requirement (i).

(v) The root mean slope $\Delta q$ is in a range between 4° and 25°.

(vi) The root mean slope $\Delta q$ is in a range between 7.5° and 25°.

(vii) The root mean slope $\Delta q$ is in a range between 10° and 25°.

(viii) The root mean slope $\Delta q$ is in a range between 14° and 19°.

The root mean slope $\Delta q$ is specified in JIS B0601-1994. The root mean slope $\Delta q$ is computed in the following manner. First, a measured curve is divided along a mean line into sections each of which has a length of $\Delta X$. Then, the inclination angle of a line segment of each section, which segment connects the starting point and the endpoint of the section, is obtained and squared. Thereafter, a mean value of the squared values is computed. Finally, the square root of the mean value is computed to obtain the root mean slope $\Delta q$. That is, the root mean slope $\Delta q$ is computed using the following equation.

$$\Delta q = \left( \frac{1}{n-1} \sum_{i=1}^{n-1} \left\{ \tan^{-1}\left(\frac{\Delta Yi}{\Delta X}\right) \right\}^2 \right)^{\frac{1}{2}}$$

When the second organic EL apparatus satisfies any one of the requirements (v) to (viii), the light exit surface 10, or the uneven surface of the second organic EL apparatus is designed to satisfy the requirement (a) or (b) for the reasons listed above.

The inventors found out that the above ranges of the values are preferable for organic EL apparatus through the following examples and comparison examples.

In the following examples and the comparison examples, forty organic EL apparatuses were made while varying the root mean slope $\Delta q$ of the light exit surface 10 in a range greater than 0° up to 30°. Other conditions including the materials, the film thicknesses, and the formulae were the same.

[Evaluation 4]

Figure 8:
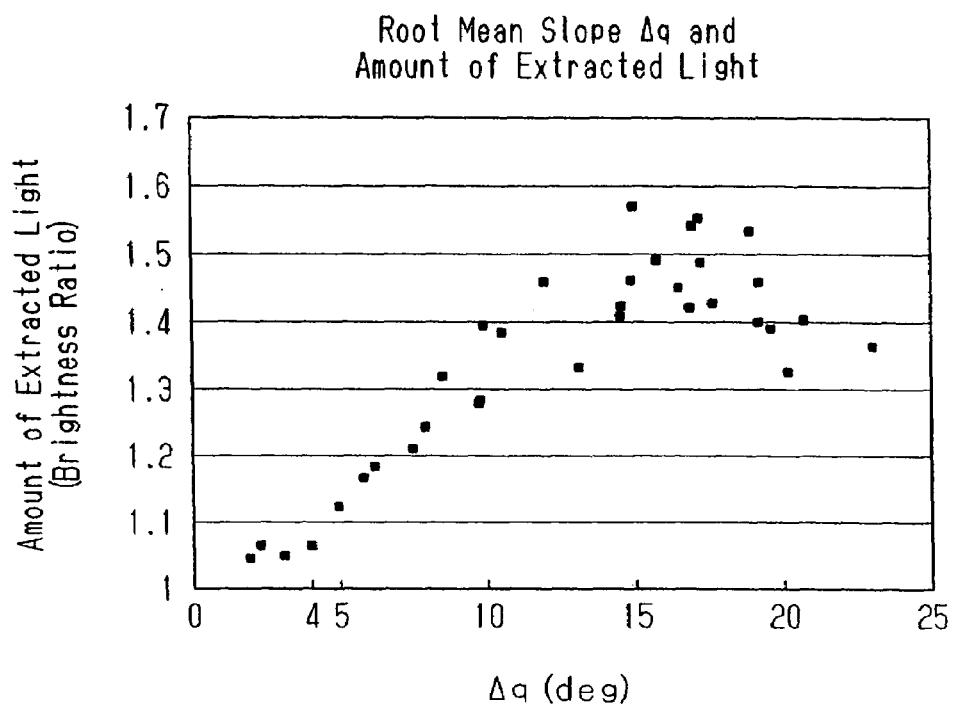
FIG. 8 is a graph showing the relationship between the root mean slope Δq of a light exit surface of a second organic EL apparatus and the amount of light emitted to the outside through the light exit surface.

The same current was supplied to each of the formed organic EL apparatuses, and the total amount of light emitted from each of the light exit surfaces 10 was measured with a brightness meter. The relationship between the root mean slope $\Delta q$ of the light exit surface 10 and the brightness of each organic EL apparatus is shown in the graph of FIG. 8. The brightness is expressed as a ratio to the brightness of an organic EL apparatus that has an organic EL device 2 formed in the same manner as described above but has no asperities on the light exit surface 10. The brightness of the referential organic EL apparatus is plotted on a position where the root mean slope $\Delta q$ is 0°. The inventors evaluated the experiment results of FIG. 8 as follows.

When the light exit surface 10 was formed into an uneven surface the root mean slope $\Delta q$ of which is in a range between 4° and 25°, inclusive, the amount of light extracted to the outside through the light exit surface 10 was 1.1 times that of the referential organic EL apparatus.

In other words, the inventors found out that, when the light exit surface 10 was formed into an uneven surface the root mean slope $\Delta q$ of which is in a range less than 4°, the amount of light extracted to the outside through the light exit surface 10 was substantially the same as that of the referential organic EL apparatus.

When the light exit surface 10 was formed into an uneven surface the root mean slope $\Delta q$ of which is in a range between 7.5° and 25°, inclusive, the amount of light extracted to the outside through the light exit surface 10 was 1.2 times that of the referential organic EL apparatus. That is, it was found out that this requirement is suitable for extracting light.

When the light exit surface 10 was formed into an uneven surface the root mean slope $\Delta a$ of which is in a range between 10° and 25°, inclusive, the amount of light extracted to the outside through the light exit surface 10 was 1.3 times that of the referential organic EL apparatus. That is, the extraction efficiency was significantly increased.

When the light exit surface 10 was formed into an uneven surface the root mean slope $\Delta q$ of which is in a range between 14° and 19°, inclusive, the amount of light extracted to the outside through the light exit surface 10 was 1.4 times that of the referential organic EL apparatus. That is, the extraction efficiency was particularly increased.

[Evaluation 5]

The chromaticity was measured in various light emitting directions from the light exit surface 10 of the formed organic EL apparatuses. The measurement revealed that in a range of the root mean slope $\Delta q$ between 4° and 25°, inclusive, the chromaticity hardly changes according to the extraction direction. That is, the chromaticity had no dependence on the extraction angle.

[Evaluation 6]

The brightness was measured in various light emitting directions from the light exit surface 10 of the formed organic EL apparatuses. The measurement revealed that in all the apparatus, the brightness in a certain direction was higher than that of other directions. The apparatuses are suitable, for example, for displays and lighting systems.

A third organic EL apparatus will now be described. The third EL apparatus can be configured to be the same as the first organic EL apparatus except for the following points. Also, the third EL apparatus can be modified in the same ways as the first organic EL apparatus.

The third organic EL apparatus is characterized in that the light exit surface 10 is formed into an uneven surface that satisfies the following requirement (xi).

(xi) The ratio Ra/S of the arithmetic mean roughness Ra and the mean spacing S of peaks is in a range between 0.01 and 0.07, inclusive.

The arithmetic mean roughness Ra is specified in JIS B0601-1994. The arithmetic mean roughness Ra is computed in the following manner. First, a section that corresponds to a referential length L is chosen from a roughness curve along a direction of a mean line. Then, the absolute values of deviations f(x) of the chosen section from the mean line are obtained. Thereafter, a mean value of the absolute values is computed and expressed in micrometers. That is, the arithmetic mean roughness Ra is computed using the following equation.

$$Ra = \frac{1}{L}\int_0^L |f(x)|dx$$

The light exit surface 10 is preferably formed into an uneven face that satisfies the following requirement (xii), instead of the above requirement (xi). More preferably, the light exit surface 10 is formed into an uneven face that satisfies the following requirement (xiii), instead of the above requirement (xi). Most preferably, the light exit surface 10 is formed into an uneven face that satisfies the following requirement (xiv), instead of the above requirement (xi).

(xii) The ratio Ra/S of the arithmetic mean roughness Ra and the mean spacing S of peaks is in a range between 0.019 and 0.07, inclusive.

(xiii) The ratio Ra/S of the arithmetic mean roughness Ra and the mean spacing S of peaks is in a range between 0.029 and 0.066, inclusive.

(xiv) The ratio Ra/S of the arithmetic mean roughness Ra and the mean spacing S of peaks is in a range between 0.035 and 0.056, inclusive.

The uneven surface (the light exit surface 10) is designed to satisfy the requirement (a) or (b).

The inventors found out that the above ranges of the values are preferable for organic EL apparatus through the following examples and comparison examples.

In the examples and the comparison examples, organic EL apparatuses were made while varying the ratio Ra/S of the arithmetic mean roughness Ra and the mean spacing S of peaks in a range between 0.005 and 0.08, inclusive. Other conditions including the materials, the film thicknesses, and the formulae were the same as the examples and the comparison examples of the first organic EL apparatus. When forming the organic EL apparatuses of the examples and comparison examples, first the light exit surface 10 having asperities was formed through etching. Then, the arithmetic mean roughness Ra and the mean spacing S of peaks of the light exit surface 10 were measured with a roughness meter. Then, the first electrode 20 was formed-on the incident surface 11.

[Evaluation 11]

Figure 9:
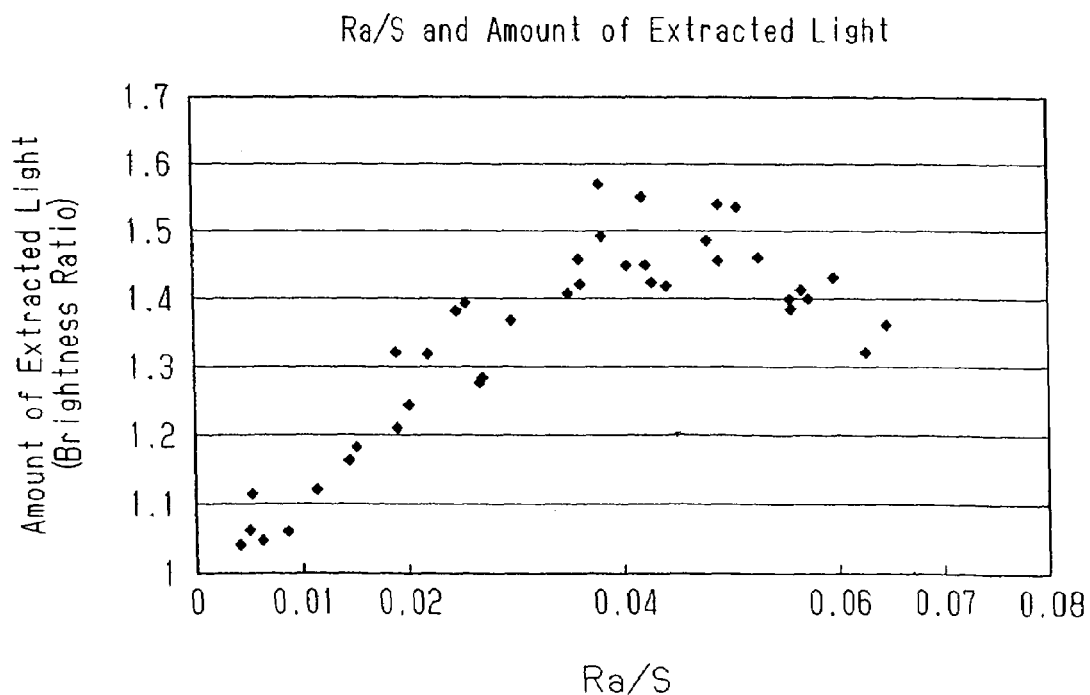
FIG. 9 is a graph showing the relationship between the ratio Ra/S of a light exit surface of a third organic EL apparatus and the amount of light emitted to the outside through the light exit surface.

The same current was supplied to each of the formed organic EL apparatuses, and the total amount of light emitted from each of the light exit surfaces 10 was measured with a brightness meter. The relationship between the ratio Ra/S of the light exit surface 10 and the brightness of the organic EL apparatuses is shown in the graph of FIG. 9. The brightness is expressed as a ratio to the brightness of an organic EL apparatus that has an organic EL device 2 formed in the same manner as described above but has no asperities on the light exit surface 10. The inventors evaluated the experiment results of FIG. 9 as follows.

When the light exit surface 10 was formed into an uneven surface the ratio Ra/S of which is in a range between 0.01 and 0.07, inclusive, the amount of light extracted to the outside through the light exit surface 10 was 1.1 times that of the referential organic EL apparatus.

Accordingly, the inventors also found out that, when the light exit surface 10 was formed into an uneven surface the ratio Ra/S of which is in a range less than 0.01, the amount of light extracted to the outside through the light exit surface 10 was substantially the same as that of the referential organic EL apparatus. That is, it was found out that, if an uneven surface suitable for extraction of light is not provided, the amount of extracted light is substantially the same as that of a flat light exit surface.

When the light exit surface 10 was formed into an uneven surface the ratio Ra/S of which is in a range between 0.019 and 0.07, inclusive, the amount of light extracted to the outside through the light exit surface 10 was 1.2 times that of the referential organic EL apparatus. That is, it was found out that this requirement is suitable for extracting light.

When the light exit surface 10 was formed into an uneven surface the ratio Ra/S of which is in a range between 0.029 and 0.066, inclusive, the amount of light extracted to the outside through the light exit surface 10 was 1.3 times that of the referential organic EL apparatus. That is, the extraction efficiency was significantly increased.

When the light exit surface 10 was formed into an uneven surface the ratio Ra/S of which is in a range between 0.035 and 0.056, inclusive, the amount of light extracted to the outside through the light exit surface 10 was 1.4 times that of the referential organic EL apparatus. That is, the extraction efficiency was particularly increased.

[Evaluation 12]

The chromaticity was measured in various light emitting directions from the light exit surface 10 of the formed organic EL apparatuses. The measurement revealed that in a range of the ratio Ra/S between 0.01 and 0.07, inclusive, the chromaticity hardly changes according to the extraction direction. That is, the chromaticity had no dependence on the extraction angle.

[Evaluation 13]

The brightness was measured in various light emitting directions from the light exit surface 10 of the formed organic EL apparatuses. The measurement revealed that in all the apparatus, the brightness in a certain direction was higher than that of other directions. The apparatuses are suitable, for example, for displays and lighting systems.

The third organic EL apparatus has substantially the same advantages as the first organic EL apparatus.

A fourth organic EL apparatus will now be described. The fourth organic EL apparatus can be configured to be the same as the first organic EL apparatus except for the following points. Also, the fourth organic EL apparatus can be modified in the same ways as the first organic EL apparatus.

The fourth organic EL apparatus substantially has the same configuration as the first organic EL apparatus, and the light exit surface 10 is characterized by satisfying any one of the following requirements (xv) to (xviii), instead of the above requirement (i).

(xv) The ratio Ra/Sm of the arithmetic mean roughness Ra and the mean spacing Sm of asperities is in a range between 0.004 and 0.035, inclusive.

(xvi) The ratio Ra/Sm of the arithmetic mean roughness Ra and the mean spacing Sm of asperities is in a range between 0.008 and 0.035, inclusive.

(xvii) The ratio Ra/Sm of the arithmetic mean roughness Ra and the mean spacing Sm of asperities is in a range between 0.012 and 0.035, inclusive.

(xviii) The ratio Ra/Sm of the arithmetic mean roughness Ra and the mean spacing Sm of asperities is in a range between 0.015 and 0.022, inclusive.

When the fourth organic EL apparatus satisfies any one of the conditions (xv) to (xviii), the fourth organic EL apparatus is designed to satisfy the requirement (a) or (b) for the reasons listed above.

The inventors found out that the above ranges of the values are preferable for organic EL apparatus through the following examples and comparison examples.

In the following examples and the comparison examples, organic EL apparatuses were made while varying the ratio Ra/Sm of the light exit surface 10 in a range between 0.001 and 0.04, inclusive. Other conditions including the materials, the film thicknesses, and the formulae were the same.

[Evaluation 14]

Figure 10:
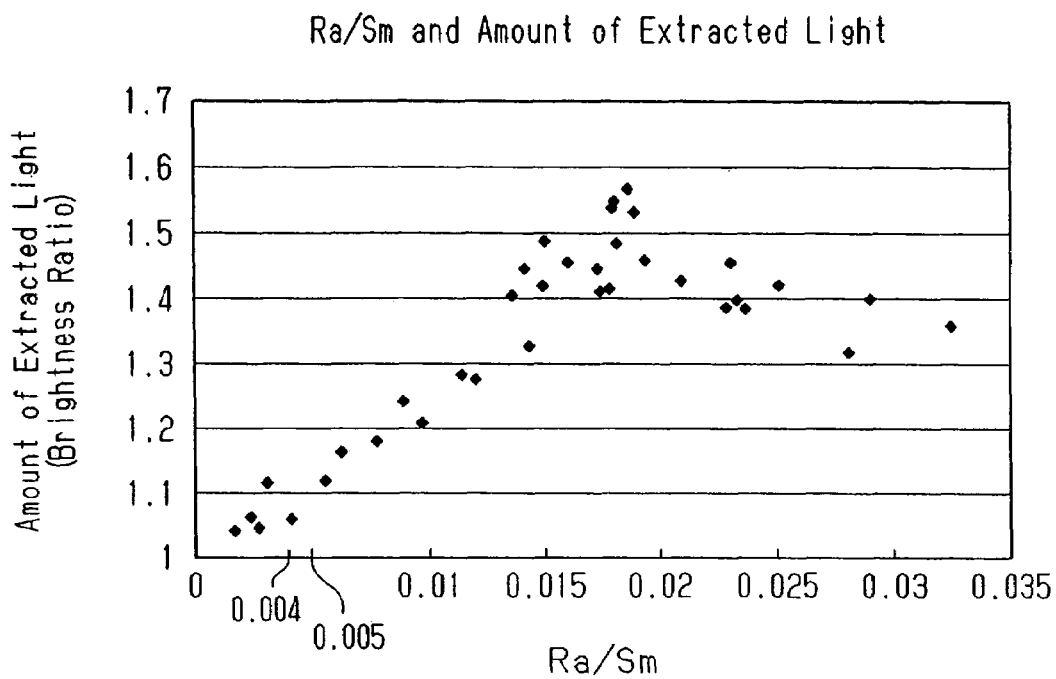
FIG. 10 is a graph showing the relationship between the ratio Ra/Sm of a light exit surface of a fourth organic EL apparatus and the amount of light emitted to the outside through the light exit surface.

The same current was supplied to each of the formed organic EL apparatuses, and the total amount of light emitted from each of the light exit surfaces 10 was measured with a brightness meter. The relationship between the ratio Ra/Sm of the light exit surface 10 and the brightness of the organic EL apparatuses is shown in the graph of FIG. 10. The brightness is expressed as a ratio to the brightness of an organic EL apparatus that has an organic EL device 2 formed in the same manner as described above but has no asperities on the light exit surface 10. The inventors evaluated the experiment results of FIG. 10 as follows.

When the light exit surface 10 was formed into an uneven surface the ratio Ra/Sm of which is in a range between 0.004 and 0.035, inclusive, the amount of light extracted to the outside through the light exit surface 10 was 1.1 times that of the referential organic EL apparatus.

In other words, the inventors found out that, when the light exit surface 10 was formed into an uneven surface the ratio Ra/Sm of which is in a range less than 0.004, the amount of light extracted to the outside through the light exit surface 10 was substantially the same as that of the referential organic EL apparatus.

When the light exit surface 10 was formed into an uneven surface the ratio Ra/Sm of which is in a range between 0.008 and 0.035, inclusive, the amount of light extracted to the outside through the light exit surface 10 was 1.2 times that of the referential organic EL apparatus. That is, it was found out that this requirement is suitable for extracting light.

When the light exit surface 10 was formed into an uneven surface the ratio Ra/Sm of which is in a range between 0.012 and 0.035, inclusive, the amount of light extracted to the outside through the light exit surface 10 was 1.3 times that of the referential organic EL apparatus. That is, the extraction efficiency was significantly increased.

When the light exit surface 10 was formed into an uneven surface the ratio Ra/Sm of which is in a range between 0.015 and 0.022, inclusive, the amount of light extracted to the outside through the light exit surface 10 was 1.4 times that of the referential organic EL apparatus. That is, the extraction efficiency was particularly increased.

[Evaluation 15]

The chromaticity was measured in various light emitting directions from the light exit surface 10 of the formed organic EL apparatuses. The measurement revealed that in a range of the ratio Ra/Sm between 0.004 and 0.035, inclusive, the chromaticity hardly changes according to the extraction direction. That is, the chromaticity had no dependence on the extraction angle.

[Evaluation 16]

The brightness was measured in various light emitting directions from the light exit surface 10 of the formed organic EL apparatuses. The measurement revealed that in all the apparatus, the brightness in a certain direction was higher than that of other directions. The apparatuses are suitable, for example, for displays and lighting systems.

A fifth organic EL apparatus will now be described. The fifth EL apparatus can be configured to be the same as the first organic EL apparatus except for the following points. Also, the fifth EL apparatus can be modified in the same ways as the first organic EL apparatus.

The fifth organic EL apparatus substantially has the same configuration as the first organic EL apparatus, and the light exit surface 10 is characterized by satisfying any one of the following requirements (xix) to (xxii), instead of the above requirement (i)

(xix) The ratio Rz/S of the ten-point height of irregularities Rz and the mean spacing S of peaks is in a range between 0.05 and 0.30, inclusive.

(xx) The ratio Rz/S of the ten-point height of irregularities Rz and the mean spacing S of peaks is in a range between 0.08 and 0.30, inclusive.

(xxi) The ratio Rz/S of the ten-point height of irregularities Rz and the mean spacing S of peaks is in a range between 0.11 and 0.25, inclusive.

(xxii) The ratio Rz/S of the ten-point height of irregularities Rz and the mean spacing S of peaks is in a range between 0.15 and 0.22, inclusive.

The ten-point height of irregularities Rz is specified in JIS B0601-1994. The ten-point height of irregularities Rz is computed in the following manner. First, a section that corresponds to a referential length L is chosen from a roughness curve along a direction in which a mean line extends. Then, the average of the five highest peaks Yp1–Yp5 from the mean line and the average depth of the five deepest valleys Yv1–Yv5 from the mean line are computed. The ten-point height of irregularities Rz is obtained by computing the sum of the averages and by expressing the sum in micrometers. That is, the ten-point height of irregularities Rz is computed using the following equation.

$$Rz = \frac{|Yp1 + Yp2 + Yp3 + Yp4 + Yp5| + |Yv1 + Yv2 + Yv3 + Yv4 + Yv5|}{5}$$

When the second organic EL apparatus satisfies any of the conditions (xix) to (xxii), the second organic EL apparatus is designed to satisfy the requirement (a) or (b) for the reasons listed above.

The inventors found out that the above ranges of the values are preferable for organic EL apparatus through the following examples and comparison examples.

In the following examples and the comparison examples, organic EL apparatuses were made while varying the ratio Rz/S of the light exit surface 10 in a range between 0.02 and 0.35, inclusive. Other conditions including the materials, the film thicknesses, and the formulae were the same as the examples and the comparison examples of the first organic EL apparatus.

[Evaluation 17]

Figure 11:
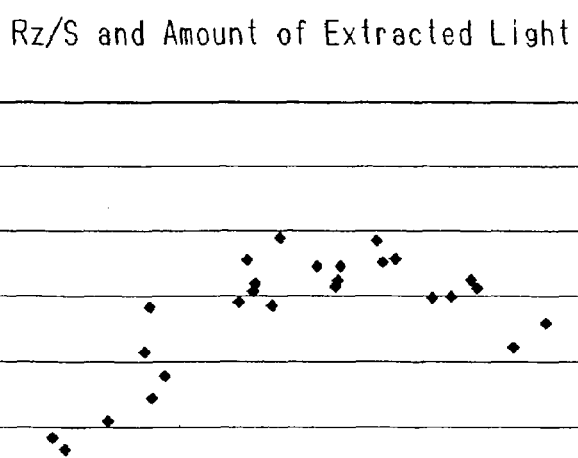
FIG. 11 is a graph showing the relationship between the ratio Rz/S of a light exit surface of a fifth organic EL apparatus and the amount of light emitted to the outside through the light exit surface.

The same current was supplied to each of the formed organic EL apparatuses, and the total amount of light emitted from each of the light exit surfaces 10 was measured with a brightness meter. The relationship between the ratio Rz/S of the light exit surface 10 and the brightness of the organic EL apparatuses is shown in the graph of FIG. 11. The brightness is expressed as a ratio to the brightness of an organic EL apparatus that has an organic EL device 2 formed in the same manner as described above but has no asperities on the light exit surface 10. The inventors evaluated the experiment results of FIG. 11 as follows.

When the light exit surface 10 was formed into an uneven surface the ratio Rz/S of which is in a range between 0.05 and 0.30, inclusive, the amount of light extracted to the outside through the light exit surface 10 was 1.1 times that of the referential organic EL apparatus.

In other words, the inventors found out that, when the light exit surface 10 was formed into an uneven surface the ratio Rz/S of which is in a range less than 0.05, the amount of light extracted to the outside through the light exit surface 10 was substantially the same as that of the referential organic EL apparatus.

When the light exit surface 10 was formed into an uneven surface the ratio Rz/S of which is in a range between 0.08 and 0.030, inclusive, the amount of light extracted to the outside through the light exit surface 10 was 1.2 times that of the referential organic EL apparatus. That is, it was found out that this requirement is suitable for extracting light.

When the light exit surface 10 was formed into an uneven surface the ratio Rz/S of which is in a range between 0.11 and 0.25, inclusive, the amount of light extracted to the outside through the light exit surface 10 was 1.3 times that of the referential organic EL apparatus. That is, the extraction efficiency was significantly increased.

When the light exit surface 10 was formed into an uneven surface the ratio Rz/S of which is in a range between 0.15 and 0.22, inclusive, the amount of light extracted to the outside through the light exit surface 10 was 1.4 times that of the referential organic EL apparatus. That is, the extraction efficiency was particularly increased.

[Evaluation 18]

The chromaticity was measured in various light emitting directions from the light exit surface 10 of the formed organic EL apparatuses. The measurement revealed that in a range of the ratio Rz/S between 0.05 and 0.30, inclusive, the chromaticity hardly changes according to the extraction direction. That is, the chromaticity had no dependence on the extraction angle.

[Evaluation 19]

The brightness was measured in various light emitting directions from the light exit surface 10 of the formed organic EL apparatuses. The measurement revealed that in all the apparatus, the brightness in a certain direction was higher than that of other directions. The apparatuses are suitable, for example, for displays and lighting systems.

A sixth organic EL apparatus will now be described. The sixth EL apparatus can be configured to be the same as the first organic EL apparatus except for the following points. Also, the sixth EL apparatus can be modified in the same ways as the first organic EL apparatus.

The sixth organic EL apparatus substantially has the same configuration as the first organic EL apparatus, and the light exit surface 10 is characterized by satisfying any one of the following requirements (xxiii) to (xxvi), instead of the above requirement (i).

(xxiii) The ratio Rz/Sm of the ten-point height of irregularities Rz and the mean spacing Sm of asperities is in a range between 0.025 and 0.14, inclusive.

(xxiv) The ratio Rz/Sm of the ten-point height of irregularities Rz and the mean spacing Sm of asperities is in a range between 0.04 and 0.14, inclusive.

(xxv) The ratio Rz/Sm of the ten-point height of irregularities Rz and the mean spacing Sm of asperities is in a range between 0.05 and 0.12, inclusive.

(xxvi) The ratio Rz/Sm of the ten-point height of irregularities Rz and the mean spacing Sm of asperities is in a range between 0.06 and 0.10, inclusive.

When the light exit surface 10 of the sixth organic EL apparatus satisfies any one of the conditions (xxiii) to (xxvi), the light exit surface 10 is designed to satisfy the requirement (a) or (b) for the reasons listed above.

The inventors found out that the above ranges of the values are preferable for organic EL apparatus through the following examples and comparison examples.

In the following examples and the comparison examples, organic EL apparatuses were made while varying the ratio Rz/Sm of the light exit surface 10 in a range between 0.005 and 0.15, inclusive. Other conditions including the materials, the film thicknesses, and the formulae were the same.

[Evaluation 20]

Figure 12:
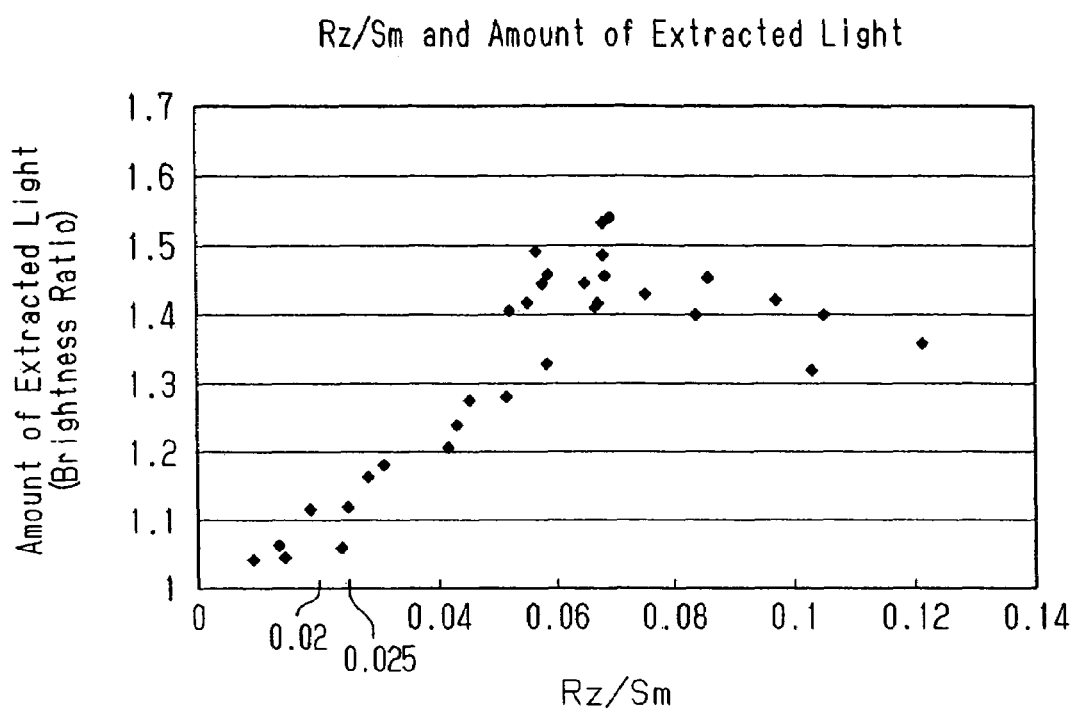
FIG. 12 is a graph showing the relationship between the ratio Rz/Sm of a light exit surface of a sixth organic EL apparatus and the amount of light emitted to the outside through the light exit surface.
Figure 13:
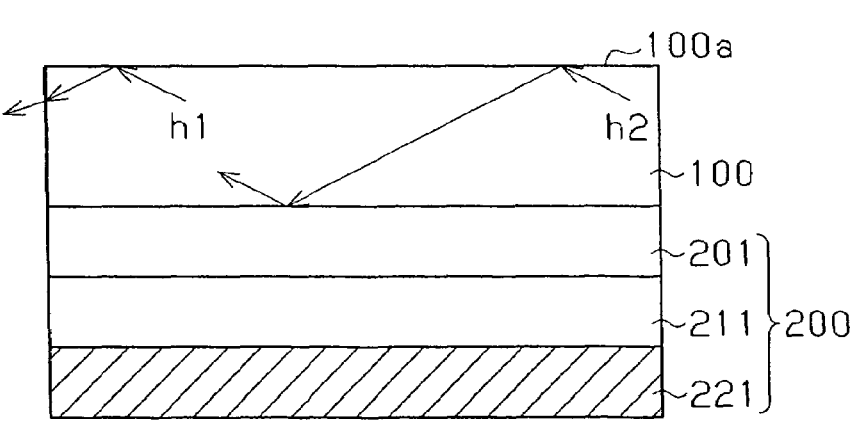
FIG. 13 is a cross-sectional view for explaining drawbacks of a prior art light-emitting apparatus.

The same current was supplied to each of the formed organic EL apparatuses, and the total amount of light emitted from each of the light exit surfaces 10 was measured with a brightness meter. The relationship between the ratio Rz/Sm of the light exit surface 10 and the brightness of the organic EL apparatuses is shown in the graph of FIG. 12. The brightness is expressed as a ratio to the brightness of an organic EL apparatus that has an organic EL device 2 formed in the same manner as described above but has no asperities on the light exit surface 10. The inventors evaluated the experiment results of FIG. 12 as follows.

When the light exit surface 10 was formed into an uneven surface the ratio Rz/Sm of which is in a range between 0.025 and 0.014, inclusive, the amount of light extracted to the outside through the light exit surface 10 was 1.1 times that of the referential organic EL apparatus.

In other words, the inventors found out that, when the light exit surface 10 was formed into an uneven surface the ratio Rz/Sm of which is in a range less than 0.025, the amount of light extracted to the outside through the light exit surface 10 was substantially the same as that of the referential organic EL apparatus.

When the light exit surface 10 was formed into an uneven surface the ratio Rz/Sm of which is in a range between 0.04 and 0.014, inclusive, the amount of light extracted to the outside through the light exit surface 10 was 1.2 times that of the referential organic EL apparatus. That is, it was found out that this requirement is suitable for extracting light.

When the light exit surface 10 was formed into an uneven surface the ratio Rz/Sm of which is in a range between 0.05 and 0.012, inclusive, the amount of light extracted to the outside through the light exit surface 10 was 1.3 times that of the referential organic EL apparatus. That is, the extraction efficiency was significantly increased.

When the light exit surface 10 was formed into an uneven surface the ratio Rz/Sm of which is in a range between 0.06 and 0.10, inclusive, the amount of light extracted to the outside through the light exit surface 10 was 1.4 times that of the referential organic EL apparatus. That is, the extraction efficiency was particularly increased.

[Evaluation 21]

The chromaticity was measured in various light emitting directions from the light exit surface 10 of the formed organic EL apparatuses. The measurement revealed that in a range of the ratio Rz/Sm between 0.025 and 0.14, inclusive, the chromaticity hardly changes according to the extraction direction. That is, the chromaticity had no dependence on the extraction angle.

[Evaluation 22]

The brightness was measured in various light emitting directions from the light exit surface 10 of the formed organic EL apparatuses. The measurement revealed that in all the apparatus, the brightness in a certain direction was higher than that of other directions. The apparatuses are suitable, for example, for displays and lighting systems.

The present examples and embodiments are to be considered as illustrative and not restrictive and the invention is not to be limited to the details given herein, but may be modified within the scope and equivalence of the appended claims.

What is claimed is:

1. A light-emitting apparatus comprising a substrate and a light-emitting device provided on the substrate,
   wherein the device includes a light-emitting layer located between a pair of electrodes, light generated by the light-emitting layer is emitted to the outside of the apparatus through the substrate, wherein a transparent member is provided on a side of the substrate opposite from the side where the light-emitting layer is provided, the transparent member having a face that faces away from the substrate and is an uneven surface having a plurality of asperities, the mean spacing Sm of adjacent asperities or the mean spacing S of peaks of adjacent projections of the asperities is no less than three times the longest wavelength of light generated by the light-emitting layer and no more than two hundred times the longest wavelength, wherein at least one of the following requirements (i)–(vi) is satisfied:
   (i) the arithmetic mean slope Δa of the uneven surface is in a range between 3° and 20°, inclusive;
   (ii) the root mean square slope Δq of the uneven surface is in a range between 4° and 25°;
   (iii) the ratio Ra/S of the arithmetic mean roughness Ra of the uneven surface to the mean spacing S of peaks is in a range between 0.01 and 0.07, inclusive;
   (iv) the ratio Ra/Sm of the arithmetic mean roughness Ra of the uneven surface to the mean spacing Sm of asperities is in a range between 0.004 and 0.035, inclusive;
   (v) the ratio Rz/S of the ten-point height of irregularities Rz of the uneven surface to the mean spacing S of peaks is in a range between 0.05 and 0.30, inclusive; and
   (vi) the ratio Rz/Sm of the ten-point height of irregularities Rz of the uneven surface to the mean spacing Sm of asperities is in a range between 0.025 and 0.14, inclusive.

2. The apparatus according to claim 1, wherein at least the requirement (i) is satisfied.

3. The apparatus according to claim 1, wherein at least the requirement (ii) is satisfied.

4. The apparatus according to claim 1, wherein at least the requirement (iii) is satisfied.

5. The apparatus according to claim 1, wherein at least the requirement (iv) is satisfied.

6. The apparatus according to claim 1, wherein at least the requirement (v) is satisfied.

7. The apparatus according to claim 1, wherein at least the requirement (vi) is satisfied.

8. The apparatus according to claim 1, wherein a prism sheet is provided on a side where light generated by the light-emitting layer is extracted.

9. The apparatus according to claim 1, wherein the light-emitting device is an organic electroluminescent device.

10. The apparatus according to claim 1, wherein the transparent member is an adhesive film.

11. A method for manufacturing a light-emitting apparatus, comprising:
    preparing a substrate;
    forming on the substrate a light-emitting device having a light-emitting layer and a pair of electrodes between which the light-emitting layer is located;
    providing a film-like transparent member on a side of the substrate opposite from the light emitting layer; and
    forming an uneven surface having a plurality of asperities on one of the faces of the transparent member, wherein the mean spacing Sm of adjacent asperities or the mean spacing S of peaks of adjacent projections of the asperities is no less than three times the longest wavelength of light generated by the light-emitting layer and no more than two hundred times the longest wavelength, wherein the uneven surface is formed such that at least one of the following requirements (i)–(vi) is satisfied:
    (i) the arithmetic mean slope Δa of the uneven surface is in a range between 3° and 20°, inclusive;
    (ii) the root mean square slope Δq of the uneven surface is in a range between 4° and 25°;
    (iii) the ratio Ra/S of the arithmetic mean roughness Ra of the uneven surface to the mean spacing S of peaks is in a range between 0.01 and 0.07, inclusive;
    (iv) the ratio Ra/Sm of the arithmetic mean roughness Ra of the uneven surface to the mean spacing Sm of asperities is in a range between 0.004 and 0.035, inclusive;
    (v) the ratio Rz/S of the ten-point height of irregularities Rz of the uneven surface to the mean spacing S of peaks is in a range between 0.05 and 0.30, inclusive; and
    (vi) the ratio Rz/Sm of the ten-point height of irregularities Rz of the uneven surface to the mean spacing Sm of asperities is in a range between 0.025 and 0.14, inclusive,
    wherein a face of the transparent member that is opposite from the uneven surface faces the substrate.

12. The method according to claim 11, wherein the uneven surface is formed prior to providing the transparent member on the substrate.

13. The method according to claim 11, wherein the transparent member is adhered to the substrate.

* * * * *